United States Patent
Douskey et al.

(10) Patent No.: US 9,964,591 B2
(45) Date of Patent: May 8, 2018

(54) IMPLEMENTING DECREASED SCAN DATA INTERDEPENDENCE IN ON PRODUCT MULTIPLE INPUT SIGNATURE REGISTER (OPMISR) THROUGH PRPG CONTROL ROTATION

(71) Applicant: International Business Machines Corporation, Armonk, NY (US)

(72) Inventors: Steven M. Douskey, Rochester, MN (US); Michael J. Hamilton, Rochester, MN (US); Amanda R. Kaufer, Rochester, MN (US); Phillip A. Senum, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 18 days.

(21) Appl. No.: 15/132,605

(22) Filed: Apr. 19, 2016

(65) Prior Publication Data

US 2017/0299654 A1  Oct. 19, 2017

(51) Int. Cl.
*G01R 31/3177* (2006.01)
*G01R 31/3183* (2006.01)
(Continued)

(52) U.S. Cl.
CPC ..... *G01R 31/3177* (2013.01); *G01R 31/3183* (2013.01); *G01R 31/31813* (2013.01)

(58) Field of Classification Search
CPC .......... G01R 31/3177; G01R 31/31813; G01R 31/3183; G01R 31/318307; G01R 31/318536; G01R 31/318544
See application file for complete search history.

(56) References Cited

U.S. PATENT DOCUMENTS 4,901,264 A * 2/1990 Hayashi ................. G06F 7/584
708/250
5,844,917 A * 12/1998 Salem ................... G06F 11/273
714/724
(Continued)

FOREIGN PATENT DOCUMENTS

CN   104410373 A   3/2015
ES     2178554 B1  9/2004

OTHER PUBLICATIONS

Iyengar, Vikram, Chakrabarty, K., & Marinissen, E. J., "Test access mechanism optimization, test scheduling, and tester data volume reduction for system-on-chip", IEEE Transactions on Computers, 52(12), 1619-1632, Dec. 2003.
(Continued)

*Primary Examiner* — April Y Blair
*Assistant Examiner* — Dipakkumar Gandhi
(74) *Attorney, Agent, or Firm* — Joan Pennington (57) ABSTRACT

A method and circuit are provided for implementing enhanced scan data testing for test time reduction and decreased scan data interdependence with on product multiple input signature register (OPMISR++) testing, and a design structure on which the subject circuit resides. A respective Pseudo-Random Pattern Generator (PRPG) provides channel input patterns to a respective associated scan channel used for the OPMISR++ diagnostics. Control inputs are coupled to the Pseudo-Random Pattern Generator (PRPG) providing PRPG control distribution. The PRPG selectively provides controlled channel input patterns for the respective scan channel responsive to the control inputs.

20 Claims, 8 Drawing Sheets

(51) Int. Cl.
G01R 31/40 (2014.01)
G01R 31/3181 (2006.01)

(56) References Cited

U.S. PATENT DOCUMENTS

| | | | | |
|---|---|---|---|---|
| 5,961,575 | A * | 10/1999 | Hervin | G06F 5/015 708/209 |
| 6,654,920 | B1 * | 11/2003 | Hetherington | G01R 31/318555 324/73.1 |
| 9,121,902 | B2 | 9/2015 | Wang et al. | |
| 2007/0283205 | A1 * | 12/2007 | Chelstrom | G01B 31/318552 714/727 |
| 2008/0022172 | A1 * | 1/2008 | Yi | G01B 31/318563 714/726 |
| 2008/0222474 | A1 * | 9/2008 | Hiraide | G01R 31/318538 714/739 |
| 2012/0030533 | A1 | 2/2012 | Douskey et al. | |
| 2012/0081949 | A1 * | 4/2012 | Adams | G11C 11/419 365/156 |
| 2014/0132290 | A1 * | 5/2014 | Charlebois | G01R 31/31858 324/750.01 |
| 2014/0281427 | A1 | 9/2014 | Abdallah | |

OTHER PUBLICATIONS

Disclosed anonymously, "DC Scan Diagnostic Method," IP.com No. I000021956D, Feb. 17, 2004.

* cited by examiner

IMPLEMENTING DECREASED SCAN DATA INTERDEPENDENCE IN ON PRODUCT MULTIPLE INPUT SIGNATURE REGISTER (OPMISR) THROUGH PRPG CONTROL ROTATION

FIELD OF THE INVENTION

The present invention relates generally to the data processing field, and more particularly, relates to a method and circuit for implementing enhanced scan data testing for test time reduction and decreased scan data interdependence in on product multiple input signature register testing with Pseudo-Random Pattern Generator (PRPG) with control (OPMISR++) with added control rotation and a design structure on which the subject circuit resides.

DESCRIPTION OF THE RELATED ART

Circuits often are prone to defects introduced during a manufacturing process. To test for defects, a scan input may be applied to scan channels, and the result of the scan input that is applied to the scan channels may be analyzed. The test may include large numbers and variations of scan inputs being applied to scan channels of the circuit. Typically the tests take a great amount of time, produce large amounts of data for analysis, and require large amounts of resources for that analysis.

As Application Specific Integrated Circuit (ASIC) and Processor chips continue to get larger, test data volume and test time naturally increase as well. It continually becomes even more important to increase test efficiency. In typical scan pattern based tests, chips are tested by scanning data into every latch in the design through a narrow, usually 32-bit wide, scan-in port and triggering functional clock pulses. Then, data is scanned out through another narrow, usually 32-bit wide, scan-out port, where it is compared to pre-computed values.

There are a few different ways that this scan-in bus can be delivered to all parts of a chip. In the naïve approach, each of the 32 scan chains contain 1/32nd of the total logic of the chip. This works and allows for the most unique data in each scan cycle, but it takes a lot of data volume to make this possible. Plus, tests tend to be quite long and require a lot of data since it requires that the entire chip is scanned in and out in each test iteration.

Alternatively, the 32-bit scan-in bus can be delivered in parallel to many parts of the chip (usually through a fan-out network feeding to many channels, which in turn feed a section of logic on the chip) at once. Typically when this is accompanied with a Multiple Input Signature Register (MISR) for an on-chip data compression this is called On Product Multiple Input Signature Register (OPMISR+). This reduces data volume, but can create an interdependence of data between channels that receive the same data. This can simply make some logic untestable or at least reduce fault coverage per cycle. This is because as each test targets a specific section of logic; feeding that same test data to other sections may not do as good a job of detecting faults there. As a result, more tests will be created to target faults in the second section of logic. So, test coverage per test pattern decreases, when compared with the fully independent scanned test data. While this seems to increase the number of tests required, the shortened scan segments used for this OPMISR+ test allow for an increased test count in the same data volume.

Another solution is to use Logic Built in Self Test (LBIST), which feeds scan-in data from a Pseudo-Random Pattern Generator (PRPG) instead of from tester pins. By doing this, no scan-in data is needed, only an initial seed. However, a PRPG can only create a limited set of patterns based on the structure and the feedback of the PRPG. The PRPG can be reseeded or the feedback equation can be changed in order to target more or different faults; however, it is difficult to do this with fault targeting in a deterministic way.

SUMMARY OF THE INVENTION

Principal aspects of the present invention are to provide a method and circuit for implementing On Product Multiple Input Signature Register (OPMISR) compression methods for test time reduction and breaking local data interdependence, and a design structure on which the subject circuit resides. Other important aspects of the present invention are to provide such method and circuit substantially without negative effects and that overcome many of the disadvantages of prior art arrangements.

In brief, a method and circuit are provided for implementing enhanced scan data testing for test time reduction and decreased scan data interdependence with on product multiple input signature register (OPMISR++) testing, and a design structure on which the subject circuit resides. A respective Pseudo-Random Pattern Generator (PRPG) provides channel input patterns to a respective associated scan channel used for the OPMISR++ diagnostics. Control inputs are coupled to the Pseudo-Random Pattern Generator (PRPG) providing PRPG control distribution. The PRPG selectively provides controlled channel input patterns for the respective scan channel responsive to the control inputs.

In accordance with features of the invention, enhanced scan data testing is effectively and efficiently implemented, enabling data volume reduction and breaking local data interdependence.

In accordance with features of the invention, a hardware arrangement sends all 32 bits to every chiplet or logic section and provides unique PRPG control data from the same 32 bit scan bus.

In accordance with features of the invention, the hardware arrangement includes rotation logic for rotating the 32 bits from the 32 bit scan bus for each logic section to provide the unique PRPG control data.

In accordance with features of the invention, for example, a rotate by 4 PRPG control distribution is provided with each logic section.

In accordance with features of the invention, the hardware arrangement includes external wiring to a separate control input on each logic section.

In accordance with features of the invention, a stump mux structure is used to serially distribute the channel data for a full scan design, automatic test pattern generation (ATPG) testing as well as OPMISR+ and ultimately the data for OPMISR++.

In accordance with features of the invention, the hardware arrangement breaks the interdependency of data between stump muxes, for example, allowing different stump muxes to receive unique PRPG control data from the same 32-bit scan bus.

In accordance with features of the invention, the hardware arrangement, breaks the interdependency of scan data allowing for increased test coverage, breaks the interdependency of scan data allowing for coverage in fewer test cycles, enables less test data as the coverage is reach in fewer test cycles.

In accordance with features of the invention, the hardware arrangement allows more flexibility with the "don't care" (fill) bits, which can be used for more random coverage or forced to minimize switching (helping reduce noise and power).

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuits are provided for implementing enhanced scan data testing for test time reduction and decreased scan data interdependence with on product multiple input signature register (OPMISR++) testing, and a design structure on which the subject circuit resides. Enhanced scan data testing is effectively and efficiently implemented, enabling data volume reduction and breaking local data interdependence.

Figure 1:
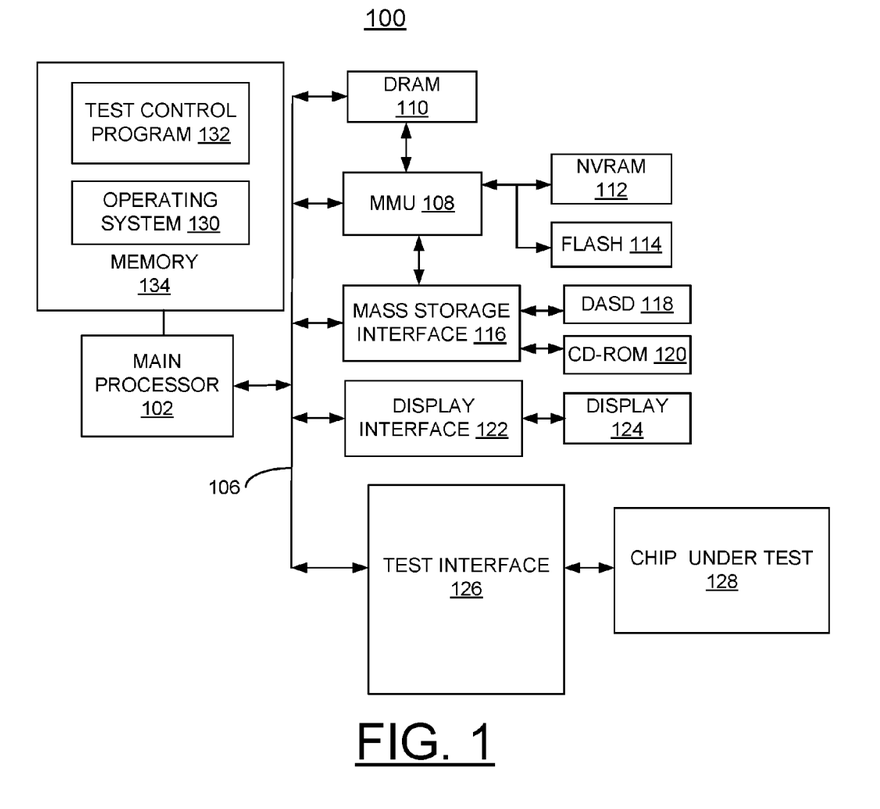
FIG. 1 is a block diagram representation illustrating an exemplary computer test system for implementing a method for providing enhanced scan data testing for test time reduction and decreased scan data interdependence with on product multiple input signature register (OPMISR) testing, and a design structure on which the subject circuit resides in accordance with the preferred embodiment.

Having reference now to the drawings, in FIG. 1, there is shown an exemplary computer test system for implementing enhanced scan data testing for test time reduction and decreased scan data interdependence with on product multiple input signature register (OPMISR++) testing generally designated by the reference character 100 in accordance with the preferred embodiment. Computer system 100 includes a main processor 102 or central processor unit (CPU) 102 coupled by a system bus 106 to a memory management unit (MMU) 108 and system memory including a dynamic random access memory (DRAM) 110, a nonvolatile random access memory (NVRAM) 112, and a flash memory 114. A mass storage interface 116 coupled to the system bus 106 and MMU 108 connects a direct access storage device (DASD) 118 and a CD-ROM drive 120 to the main processor 102. Computer system 100 includes a display interface 122 connected to a display 124, and a test interface 126 coupled to the system bus 106. An integrated circuit device or chip under test 128 is coupled to the test interface 226. Computer system 100 includes an operating system 130, and a test control program 132 of the preferred embodiment resident in a memory 134.

Computer test system 100 is shown in simplified form sufficient for understanding the present invention. The illustrated computer test system 100 is not intended to imply architectural or functional limitations. The present invention can be used with various hardware implementations and systems and various other internal hardware devices, for example, multiple main processors.

Figure 2A:
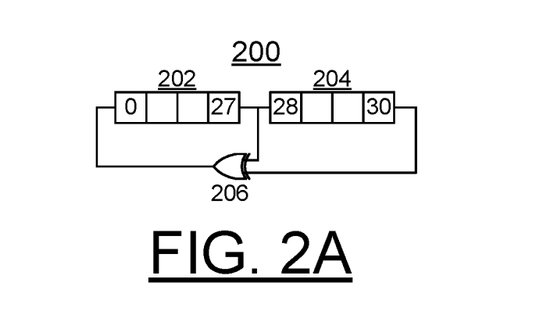
FIGS. 2A and 2B respectively illustrate an example Pseudo-Random Pattern Generator (PRPG) circuit and an example modified Pseudo-Random Pattern Generator (PRPG) in accordance with preferred embodiments of the invention.
Figure 2B:
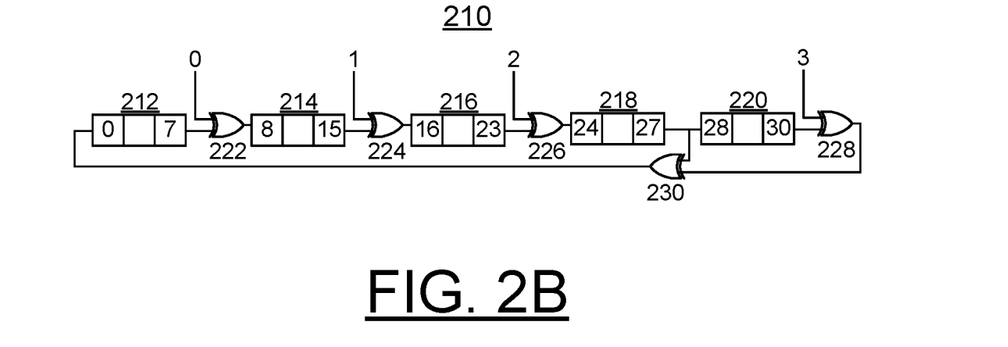

Referring now to FIGS. 2A and 2B, there are respectively shown an example Pseudo-Random Pattern Generator (PRPG) circuit generally designated by the reference character 200 and an example modified Pseudo-Random Pattern Generator (PRPG) in accordance with preferred embodiments of the invention generally designated by the reference character 210. PRPG circuit 200 includes, for example, a 31 bit PRPG with sections 202, 204, and an exclusive OR (XOR) 206 having two inputs coupled between the sections 202, 204 and to the output of section 204, providing an input to section 202.

PRPG circuit 210 includes, for example, a 31 bit PRPG with sections 212, 214, 216, 218, 220, and a respective exclusive OR (XOR) 222, 224, 226, 228 having two inputs with a first input receiving a respective control input, 0, 1, 2, 3, and a second input connected to a respective section 212, 214, 216, 220. An XOR 230 providing a feedback input to section 212 includes two inputs, one input coupled between the sections 218, 220 and one input to the output of section 220.

To further reduce data volume, but maintain a more deterministic test, OPMISR++ of the preferred embodiments uses a PRPG, such as PRPG 210 including a set number of pins, typically 4, or pins 0, 1, 2, 3, as shown in FIG. 2B to generate data while maintaining the MISR for data collection. The pins 0, 1, 2, 3 insert data into the PRPG 210 to first set the initial seed value then periodically direct the test data from the PRPG 210 when needed to focus coverage. In other words, the pins 0, 1, 2, 3 help create the "care" bits of the test, while the PRPG 210 fills in the rest of the bits for added random coverage. In this manner, the data needed for the test has been reduced from 32 bits to 4, while the interdependence is increased as there are only 4 bits that initialize all PRPGs and force all care bits.

Figure 3A:
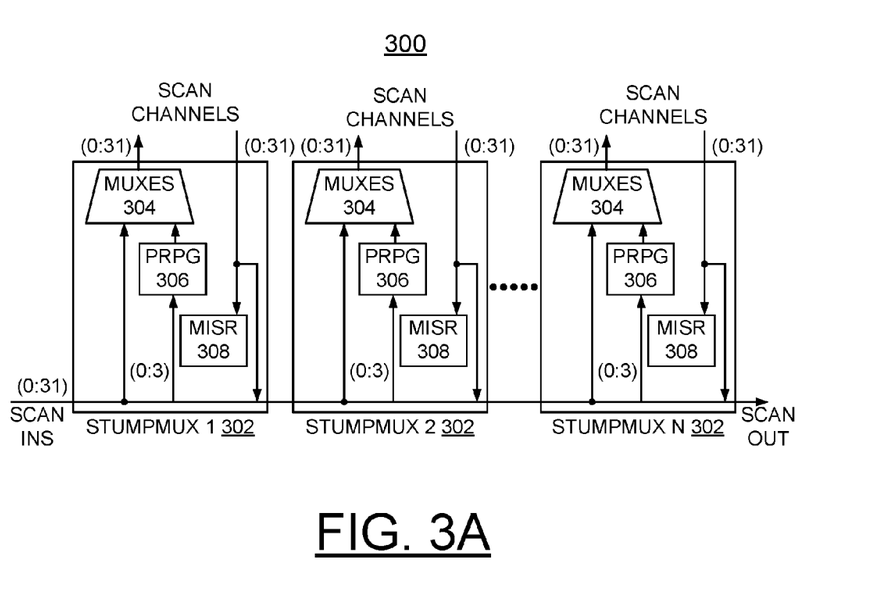
FIGS. 3A, 3B, and 3C respectively illustrate circuits for implementing On Product Multiple Input Signature Register (OPMISR) compression methods for test time reduction and breaking local data interdependence diagnostics in accordance with preferred embodiments of the invention.
Figure 3B:
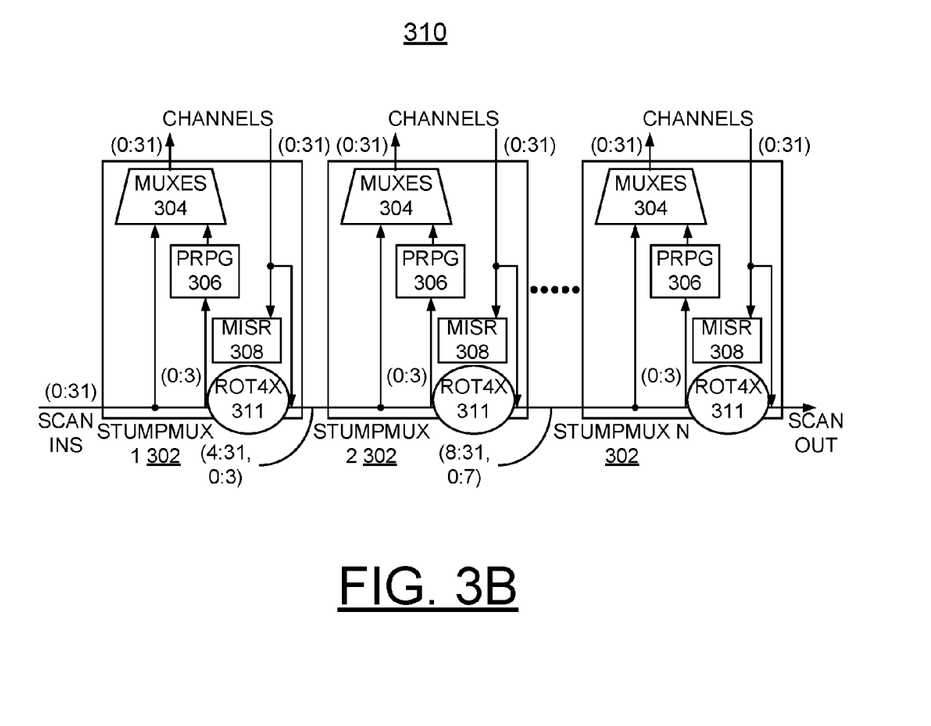
Figure 3C:
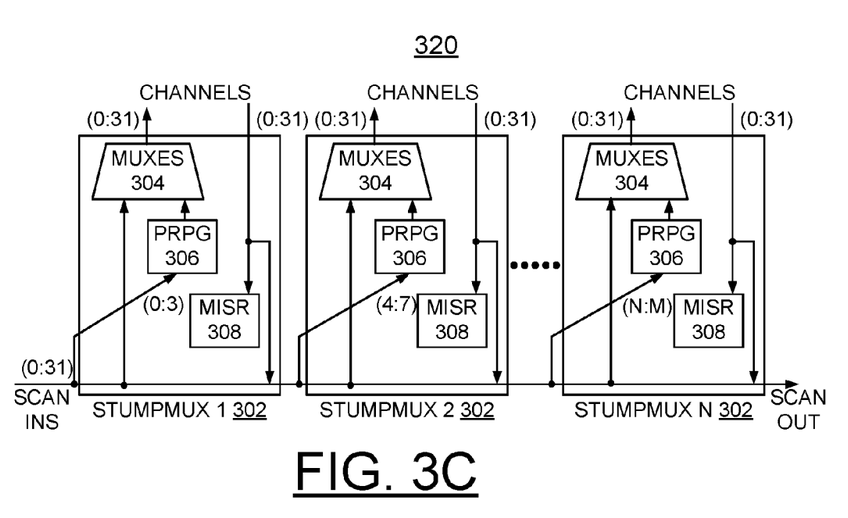

FIGS. 3A, 3B, and 3C respectively illustrate circuits generally designated by the reference characters 300, 310, 320 for implementing On Product Multiple Input Signature Register (OPMISR) compression methods for test time reduction and breaking local data interdependence diagnostics in accordance with preferred embodiments of the invention.

In accordance with features of the invention, a respective Pseudo-Random Pattern Generator (PRPG) provides channel input patterns to a respective associated scan channels used for the OPMISR++ diagnostics. Control inputs are coupled to the Pseudo-Random Pattern Generator (PRPG) providing PRPG control distribution. The PRPG selectively provides controlled channel input patterns for the respective scan channel responsive to the control inputs.

In FIGS. 3A, 3B, and 3C, circuits 300, 310, and 320 use OPMISR++ including a Stump mux daisy-chain structure used to serially distribute the channel data for the full scan design, automatic test pattern generation (ATPG) testing and OPMISR+ and data for OPMISR++.

For example in FIG. 3A, 32 inputs are provided to support OPMISR++ testing, with 8-4 bit groups sent to different chiplets or logical sections in the design under this. This would then allow the chiplets or logical sections to get PRPG seeds and care bit data suitable for testing that chiplet, while other chiplets get different data focused on their test needs. While this helps test coverage, it does lose much of the data volume advantage. It also continues to be somewhat test coverage limiting as after 8 chiplets or logical sections the same 4 pins will be reused by other chiplets, and all PRPGs within a chiplet will locally get the same data from the 4 pins, so a local interdependence issue still exists.

In FIGS. 3A, 3B, and 3C, each of the circuits 300, 310, and 320 includes a plurality of stump muxes 302 1-N. Each of the stump muxes 302, 1-N includes muxes 304 having inputs coupled to a 32 bit scan bus (0:31) and a PRPG 306. In FIG. 3A, the PRPGs 306 receive control input bits. Muxes 304 provide scan bits (0:31) to associated scan channels. Each of the stump muxes 302, 1-N includes a Multiple Input Signature Register (MISR) 308 collecting data from the associated scan channels with the scan channel data also coupled to the 32 bit scan bus (0:31). Each of the circuits 300, 310, and 320 require 32 inputs to support full scan ATPG testing.

In accordance with features of the invention, a hardware change solves the local data interdependence issue by instead sending all 32 bits to every chiplet and rotating through different 4 bit combinations, for example as shown circuit 310 in FIG. 3B. This breaks the interdependency of data between stump muxes 302, allowing different stump muxes 302 to receive unique PRPG control data (0:3) from the same 32-bit scan bus. For example as shown in FIG. 3C, the hardware arrangement as shown in circuit 320 includes external wiring to a separate control input on each logic section.

In FIG. 3B, circuit 310 of the preferred embodiments further includes a rotation function 311 such as a rotate by 4 (ROT4X) 310, as shown. Circuit 310 provides enhanced scan data testing effectively and efficiently implemented, enabling data volume reduction and breaking local data interdependence. The rotation function 311, ROT4X solving the local data interdependence issue, rotates the scan bus by 4 before it leaves each stump mux 302. Thus, even though every stump mux 302 feeds bits 0 through 3 to the PRPG 306, the actual bits used are unique for each set of eight stump muxes 302, at which time a full 32-bit rotation will have been performed.

TABLE 1

| Scan In Bit | Scan Out Bit | Scan In Bit | Scan Out Bit | Scan In Bit | Scan Out Bit | Scan In Bit | Scan Out Bit |
|---|---|---|---|---|---|---|---|
| 0 | 4 | 8 | 12 | 16 | 20 | 24 | 28 |
| 1 | 5 | 9 | 13 | 17 | 21 | 25 | 29 |
| 2 | 6 | 10 | 14 | 18 | 22 | 26 | 30 |
| 3 | 7 | 11 | 15 | 19 | 23 | 27 | 31 |
| 4 | 8 | 12 | 16 | 20 | 24 | 28 | 0 |
| 5 | 9 | 13 | 17 | 21 | 25 | 29 | 1 |
| 6 | 10 | 14 | 18 | 22 | 26 | 30 | 2 |
| 7 | 11 | 15 | 19 | 23 | 27 | 31 | 3 |

In accordance with features of the invention, circuits 310 and 320 breaks the interdependency of data between stump muxes, allowing different stump muxes to receive unique PRPG control data from the same 32-bit scan bus. This hardware arrangement, breaks the interdependency of scan data allowing for increased test coverage, breaks the interdependency of scan data allowing for coverage in fewer test cycles, and enables less test data as the coverage is reach in fewer test cycles. The hardware arrangement allows more flexibility with the "don't care" (fill) bits, which can be used for more random coverage or forced to minimize switching (helping reduce noise and power). circuit 320 includes external wiring to a separate control input on each logic section.

In FIG. 3C, circuit 320 of the preferred embodiments further includes the hardware arrangement includes external wiring providing a separate control input on each logic section. Circuit 320 instead of having the fixed rotation, includes selecting the 4 PRPG control bits via 1) configuration bits in each stump mux 302, and 2) with external wiring to a separate 4 bit input to PRPG 306 on each stump mux 302. Both of these have the advantage of allowing rotation of other than 4 bits. So after 8 Stump muxes 302 rather than repeating the 4 bit selection a new combination of bits could be created. While more complicated this is yet another way to break the interdependence. Note that the first configuration bits arrangement requires significant hardware additions and an extra initialization step, it is the most flexible solution as new combinations may be programmed in before any test. The second with external wiring is by far the least hardware cost, even less than the original rotation scheme, providing at least equal if not better coverage than the rotation scheme of circuit 310.

As shown, circuit 320 includes stump mux 302, #1 receives the 4 bit input (0:3) to PRPG 306, stump mux 302, #2 receives the 4 bit input (4:7) to PRPG 306, and stump mux 302, #N receives the 4 bit input (M:N) to PRPG 306.

In accordance with features of the invention, circuits 310 and 320 have the advantage of allowing rotation or assignment of many other than 4 bit combinations. So after 8 stump muxes 302 rather than repeating the 4 bit selection a new combination of bits could be created. While more complicated this is yet another way to break the interdependence.

Figure 4:
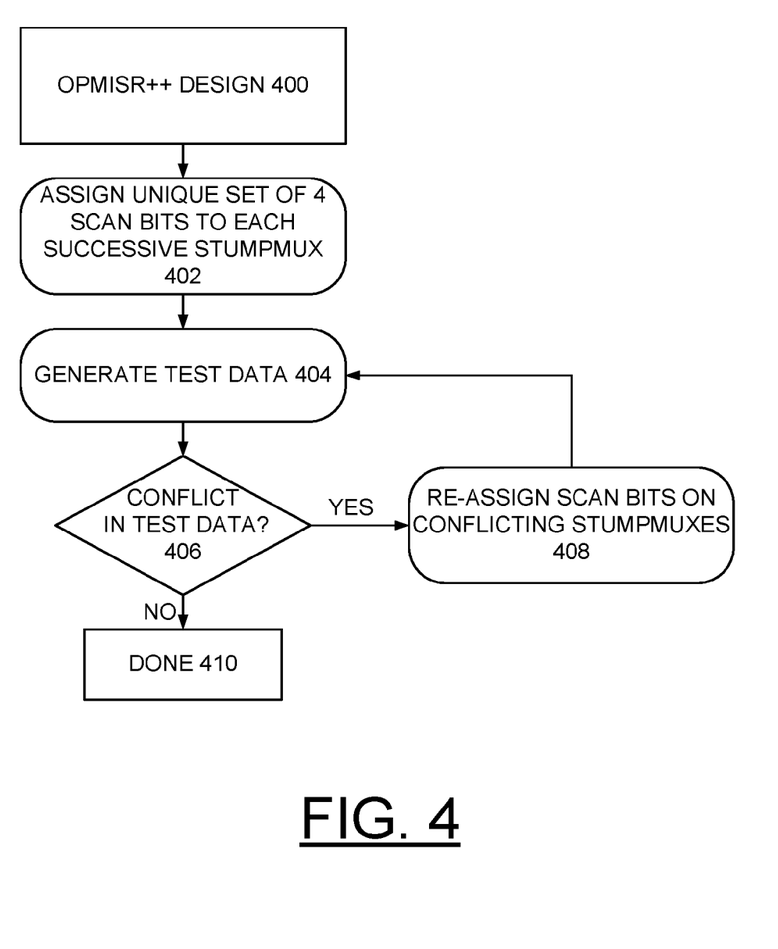
FIG. 4 is a flow chart illustrating example test operations in accordance with the preferred embodiments.

Referring to FIG. 4, there is shown a flow chart illustrating example test operations for inserting the scan rotation/re-assignment in accordance with the preferred embodiments. As shown in a block 400, operations begin with an OPMISR++ scan design, with 4 bits feeding to each PRPG. On each successive stump mux in the scan ring, assign a unique set of 4 scan bits to feed the PRPG or as much as possible as indicated in a block 402. Then generate test data as indicated in a block 404. Checking for conflict in test is performed as indicated in a decision block 406. When conflict in test is identified, scan bits on conflicting stump muxes are re-assigned as indicated in a block 408. When no conflict in test is identified, the operations are done as indicated in a block 410.

Additionally, there are usually chiplet select signals for each chiplet or logic section that must be enabled to scan. This means that, if desired, scanning can be stopped on chiplets during some or all scan cycles. If two chiplets contain Stump muxes that receive the same scan data from the PRPG control and PRPG logic, then this select signal could be used to temporarily stop scanning some or most of the chiplets. This function then creates an offset of scan data on the selected chiplet. In this manner, adding a few scan clock cycles may prevent the need for a full additional test, or may even allow a data combination for a test that could not have been triggered otherwise.

Figure 5:
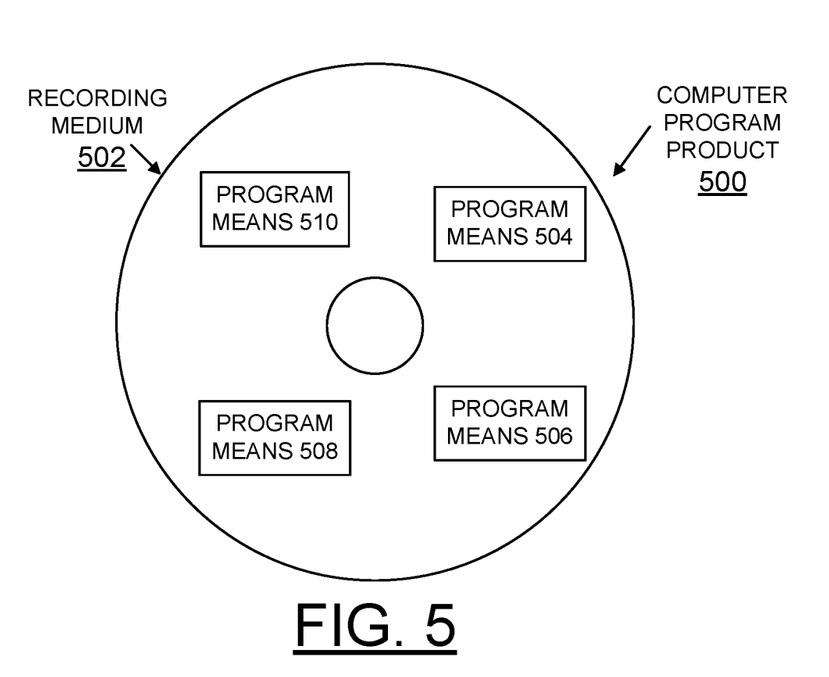
FIG. 5 is a block diagram illustrating a computer program product in accordance with the preferred embodiments.

Referring now to FIG. 5, an article of manufacture or a computer program product 500 of the invention is illustrated. The computer program product 500 includes a recording medium 502, such as, a floppy disk, a high capacity read only memory in the form of an optically read compact disk or CD-ROM, a tape, or another similar computer program product. Recording medium 502 stores program means 504, 506, 508, and 510 on the medium 502 for carrying out the methods for implementing scan testing diagnostics of the preferred embodiment in the system 100 of FIG. 1.

A sequence of program instructions or a logical assembly of one or more interrelated modules defined by the recorded program means 504, 506, 508, and 510, direct the computer system 100 for implementing scan testing diagnostics of the preferred embodiment.

Figure 6:
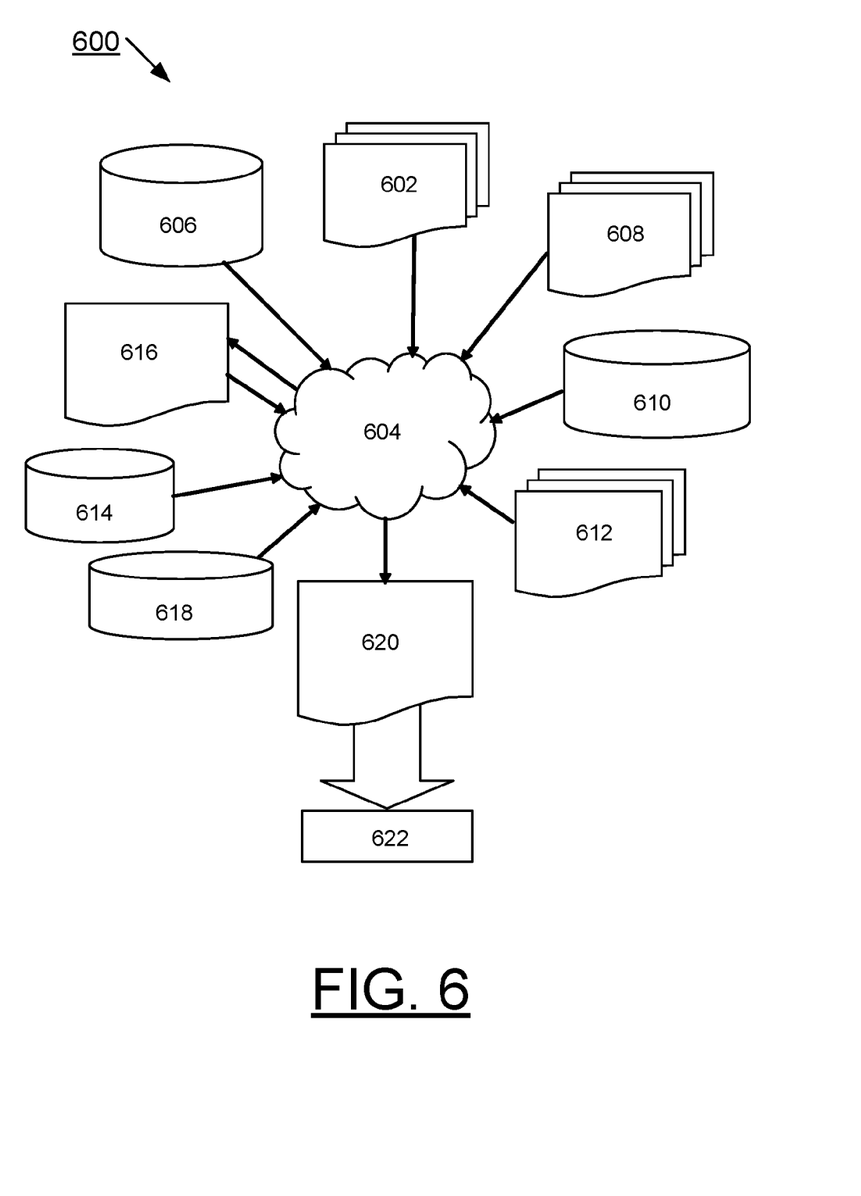
FIG. 6 is a flow diagram of a design process used in semiconductor design, manufacturing, and/or test.

FIG. 6 shows a block diagram of an example design flow 600. Design flow 600 may vary depending on the type of IC being designed. For example, a design flow 600 for building an application specific IC (ASIC) may differ from a design flow 600 for designing a standard component. Design structure 602 is preferably an input to a design process 604 and may come from an IP provider, a core developer, or other design company or may be generated by the operator of the design flow, or from other sources. Design structure 602 comprises circuits 200, 220, 300, 310, 320 in the form of schematics or HDL, a hardware-description language, for example, Verilog, VHDL, C, and the like. Design structure 602 may be contained on one or more machine readable medium. For example, design structure 602 may be a text file or a graphical representation of circuits 200, 220, 300, 310, 320. Design process 604 preferably synthesizes, or translates, circuits 200, 220, 300, 310, 320 into a netlist 606, where netlist 606 is, for example, a list of wires, transistors, logic gates, control circuits, I/O, models, etc. that describes the connections to other elements and circuits in an integrated circuit design and recorded on at least one of machine readable medium. This may be an iterative process in which netlist 606 is resynthesized one or more times depending on design specifications and parameters for the circuits.

Design process 604 may include using a variety of inputs; for example, inputs from library elements 608 which may house a set of commonly used elements, circuits, and devices, including models, layouts, and symbolic representations, for a given manufacturing technology, such as different technology nodes, design specifications 610, characterization data 612, verification data 614, design rules 616, and test data files 618, which may include test patterns and other testing information. Design process 604 may further include, for example, standard circuit design processes such as timing analysis, verification, design rule checking, place and route operations, and the like. One of ordinary skill in the art of integrated circuit design can appreciate the extent of possible electronic design automation tools and applications used in design process 604 without deviating from the scope and spirit of the invention. The design structure of the invention is not limited to any specific design flow.

Design process 604 preferably translates an embodiment of the invention as shown in FIGS. 2B, 3B, and 3C along with any additional integrated circuit design or data (if applicable), into a second design structure 620. Design structure 620 resides on a storage medium in a data format used for the exchange of layout data of integrated circuits, for example, information stored in a GDSII (GDS2), GL1, OASIS, or any other suitable format for storing such design structures. Design structure 620 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 2B, 3B, and 3C. Design structure 620 may then proceed to a stage 622 where, for example, design structure 620 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing enhanced scan data testing for test time reduction and decreased scan data interdependence with on product multiple input signature register (OPMISR++) testing comprising:

providing a respective Pseudo-Random Pattern Generator (PRPG) for providing test data applied to a respective associated scan channel used for the OPMISR++ diagnostics;

providing control inputs coupled to said respective Pseudo-Random Pattern Generator (PRPG) providing PRPG control distribution; said control inputs providing unique PRPG control data to said respective PRPG from a scan bus; said respective PRPG selectively providing controlled channel input patterns for the respective associated scan channel responsive to the control inputs enabling data volume reduction and breaking local data interdependence; and providing a multiple input signature registers (MISR) for data collection with each said respective associated scan channel.

2. The method as recited in claim 1 includes providing a hardware arrangement with a 32 bit scan bus, sending all 32 bits to said respective associated scan channel and providing said control inputs coupled to said Pseudo-Random Pattern Generator (PRPG) from the 32 bit scan bus.

3. The method as recited in claim 2 wherein providing said control inputs coupled to said Pseudo-Random Pattern Generator (PRPG) for providing PRPG control distribution includes providing unique PRPG control data from the 32 bit scan bus.

4. The method as recited in claim 2 wherein providing said hardware arrangement with the 32 bit scan bus includes providing rotation logic for rotating the 32 bits from the 32 bit scan bus to provide unique PRPG control data.

5. The method as recited in claim 1 includes providing a stump mux structure used to serially distribute channel data for a full scan design, automatic test pattern generation (ATPG) testing and the OPMISR++ testing.

6. The method as recited in claim 5 includes providing configuration bits in each stump mux to provide said control inputs coupled to said Pseudo-Random Pattern Generator (PRPG).

7. The method as recited in claim 6 includes providing external wiring to a separate 4 bit input in each stump mux to provide said control input coupled to said Pseudo-Random Pattern Generator (PRPG).

8. A circuit for implementing enhanced scan data testing for test time reduction and decreased scan data interdependence with on product multiple input signature register (OPMISR++) testing comprising:
 a respective Pseudo-Random Pattern Generator (PRPG) providing test data applied to a respective associated scan channel used for the OPMISR++ diagnostics;
 control inputs coupled to said respective Pseudo-Random Pattern Generator (PRPG) for providing PRPG control distribution; said control inputs providing unique PRPG control data to said respective PRPG from a scan bus; said respective PRPG selectively providing controlled channel input patterns for the respective associated scan channel responsive to the control inputs enabling data volume reduction and breaking local data interdependence; and
 a multiple input signature registers (MISR) for data collection provided with each respective associated scan channel.

9. The circuit as recited in claim 8 includes a stump mux structure used to serially distribute channel data for a full scan design, automatic test pattern generation (ATPG) testing and the OPMISR++ testing.

10. The circuit as recited in claim 8 includes a hardware arrangement with a 32 bit scan bus for sending all 32 bits to each respective associated scan channel and for providing said control inputs coupled to said respective Pseudo-Random Pattern Generator (PRPG) from the 32 bit scan bus.

11. The circuit as recited in claim 10 includes at least one multiplexer coupled between said 32 bit scan bus and said PRPG and said respective associated scan channel used for the OPMISR++ diagnostics.

12. The circuit as recited in claim 10 includes rotation function for rotating the 32 bits from the 32 bit scan bus to provide said control inputs coupled to said respective PRPG.

13. The circuit as recited in claim 10 includes external wiring providing separate control inputs to said respective Pseudo-Random Pattern Generator (PRPG).

14. A design structure embodied in a non-transitory machine readable medium used in a design process medium used in a design process for designing, manufacturing, or testing an integrated circuit, the design structure comprising:
 a circuit tangibly embodied in the non-transitory machine readable medium used in the design process, said circuit for implementing scan data testing for test time reduction and decreased scan data interdependence with on product multiple input signature register (OPMISR++) testing, said circuit comprising:
 a respective Pseudo-Random Pattern Generator (PRPG) providing test data applied to a respective associated scan channel used for the OPMISR++ diagnostics;
 control inputs coupled to said respective Pseudo-Random Pattern Generator (PRPG) for providing PRPG control distribution; said control inputs providing unique PRPG control data to said respective PRPG from a scan bus; said respective PRPG selectively providing controlled channel input patterns for the respective associated scan channel responsive to the control inputs enabling data volume reduction and breaking local data interdependence; and
 a multiple input signature registers (MISR) for data collection provided with each respective associated scan channel, wherein the design structure, when read and used in the manufacture of a semiconductor chip produces a chip comprising said circuit.

15. The design structure of claim 14, wherein the design structure comprises a netlist, which describes said circuit.

16. The design structure of claim 15 wherein the design structure resides on non-transitory machine readable medium as a data format used for the exchange of layout data of integrated circuits.

17. The design structure of claim 15, wherein the design structure includes at least one of test data files, characterization data, verification data, or design specifications.

18. The design structure of claim 15, wherein said circuit includes a 32 bit scan bus for sending all 32 bits to each said respective associated scan channel and for providing said control inputs coupled to said respective Pseudo-Random Pattern Generator (PRPG) from the 32 bit scan bus.

19. The design structure of claim 18, wherein said circuit includes a rotation function for rotating the 32 bits from the 32 bit scan bus and providing said control inputs coupled to said respective Pseudo-Random Pattern Generator (PRPG).

20. The design structure of claim 18, wherein said circuit includes external wiring to a separate 4 bit input in each stump mux to provide said control i inputs coupled to said respective Pseudo-Random Pattern Generator (PRPG).

\* \* \* \* \*